United States Patent [19]
Nowak et al.

[11] Patent Number: 5,865,896
[45] Date of Patent: *Feb. 2, 1999

[54] HIGH DENSITY PLASMA CVD REACTOR WITH COMBINED INDUCTIVE AND CAPACITIVE COUPLING

[75] Inventors: Romuald Nowak, Cupertino; Kevin Fairbairn, Saratoga; Fred C. Redeker, Fremont, all of Calif.

[73] Assignee: Applied Materials, Inc., Santa Clara, Calif.

[ * ] Notice: The term of this patent shall not extend beyond the expiration date of Pat. No. 5,614,055.

[21] Appl. No.: 766,053

[22] Filed: Dec. 16, 1996

Related U.S. Application Data

[63] Continuation of Ser. No. 234,746, Apr. 26, 1994, abandoned, which is a continuation-in-part of Ser. No. 113,776, Aug. 27, 1993, Pat. No. 5,614,055.

[51] Int. Cl.$^6$ .......................... C23C 16/00; C23C 14/00; C23F 1/02
[52] U.S. Cl. ................................. 118/723 I; 118/723 IR; 118/723 E; 118/723 AN; 156/345; 204/298.33; 204/298.34
[58] Field of Search ........................ 204/298.33, 298.34; 156/345; 118/723 R, 723 I, 723 IR, 723 E, 723 AN, 723 MW

[56] References Cited

U.S. PATENT DOCUMENTS

| | | | |
|---|---|---|---|
| 4,844,775 | 7/1989 | Keeble | 156/345 |
| 5,074,456 | 12/1991 | Degner et al. | 156/345 |
| 5,252,178 | 10/1993 | Moslehi | 156/345 |
| 5,268,200 | 12/1993 | Steger | 156/345 |
| 5,290,993 | 3/1994 | Kaji et al. | 156/345 |
| 5,346,578 | 9/1994 | Benzing et al. | 156/345 |
| 5,556,501 | 9/1996 | Collins et al. | 204/298.34 |
| 5,614,055 | 3/1997 | Fairbairn et al. | 118/723 IR |

FOREIGN PATENT DOCUMENTS

| | | |
|---|---|---|
| 0 552 491 A1 | 12/1992 | European Pat. Off. . |
| 2231197 | 11/1990 | United Kingdom . |

*Primary Examiner*—M. Nuzzolillo
*Assistant Examiner*—Rodney G. McDonald
*Attorney, Agent, or Firm*—Michaelson & Wallace

[57] ABSTRACT

The invention is embodied in a plasma reactor having a vacuum chamber with a cylindrical side portion and a ceiling at a certain height above the top of the cylindrical side portion, a wafer-holding pedestal near the bottom of the vacuum chamber, gas injection ports near the cylindrical side portion and a vacuum pump, the reactor including a generally planar disk-shaped conductive ceiling electrode adjacent the ceiling, a helical coil antenna having a bottom winding near the top of the cylindrical side portion and a top winding generally corresponding to the second diameter near the planar disk-shaped conductive ceiling electrode, the helical coil antenna substantially spanning the height between the top of the cylindrical side portion and the ceiling, and a switch for individually connecting each one of the coil antenna, the ceiling electrode and the wafer pedestal to one of (a) a respective RF power source or (b) ground or (c) a floating potential (i.e., unconnected to any potential source). The invention is also embodied in a plasma reactor having a vacuum chamber, a wafer-holding pedestal near the bottom of the vacuum chamber, gas injection ports and a vacuum pump, the reactor including a conductive ceiling electrode at the top of the chamber, a coil antenna having a top generally coplanar with the ceiling electrode and a base generally coinciding with a circumference of the vacuum chamber, and a switch for individually connecting each one of the coil antenna, the ceiling electrode and the wafer pedestal to one of (a) a respective RF power source, or (b) ground or (c) a floating potential. In one embodiment, the reactor is a chemical vapor deposition plasma reactor.

47 Claims, 1 Drawing Sheet

HIGH DENSITY PLASMA CVD REACTOR WITH COMBINED INDUCTIVE AND CAPACITIVE COUPLING

RELATED APPLICATIONS

This is a continuation of application Ser. No. 08/234,746, filed Apr. 26, 1994, now abandoned, which is a continuation-in-part application Ser. No. 08/113,776, Aug. 27, 1993, now U.S. Pat. No. 5,614,055.

BACKGROUND OF THE INVENTION

1. Technical Field

The invention is related to a high density plasma CVD reactor having inductive and capacitive coupling modes which can be selected individually or in combination for chamber cleaning operations.

2. Background Art

Plasma reactors used for semiconductor processes such as chemical vapor deposition (CVD), etching, reactive ion etching and so forth typically employ either inductive coupling or capacitive coupling to strike and maintain a plasma. Typically, an etch reactor employs capacitive coupling because the high ion energies characteristic of capacitively coupled plasmas are suitable for removing films such as, for example, silicon dioxide. The high ion energies arise from the high electric fields required to strike a capacitively coupled plasma. For example, as disclosed in European Patent Application publication No. 0 552 491 A1 by Collins et al. entitled "Plasma Etch Process" published Jul. 28, 1993, a capacitively coupled reactor has parallel electrodes, including a grounded electrode in the ceiling and an RF biased electrode in the wafer pedestal.

However, the plasma density of a capacitively coupled plasma is not sufficient for performing simultaneous chemical vapor deposition (CVD) and in-situ sputtering at low pressures. Accordingly, a CVD plasma reactor of the type disclosed in U.S. patent application Ser. No. 08/113,776 entitled "High Density Plasma CVD and Etching Reactor" filed Aug. 27, 1993 by Fairbairn and Nowak employs inductive coupling to strike and maintain the plasma. In the Fairbairn and Nowak application, a domed-shaped helical coil in a dome-shaped chamber ceiling performs the inductive coupling to the plasma at a low chamber pressure (below 100 milliTorr), the dome shape providing a more uniform ion density distribution across the semiconductor wafer. Such an inductively coupled plasma is characterized by a high ion density and is therefore suitable for low pressure CVD plasma processing at high processing (e.g., deposition) rates.

The main differences between capacitively coupled plasmas and inductively coupled plasmas are the following: An inductively coupled plasma has a plasma density which is up to two orders of magnitude higher, thereby providing higher processing rates. A capacitively coupled plasma has a higher electrode sheet voltage, higher self-biasing and higher plasma impedance, and therefore provides higher sputtering rates and greater risk of damage to the wafer. An inductively coupled plasma exhibits lower ion energy distribution, providing a lower risk of damage to the wafer.

A requirement of all plasma reactors, and especially plasma CVD reactors, is that they must be cleaned periodically to remove deposits and residue. For example, in a CVD reactor, during deposition of silicon dioxide onto a semiconductor wafer, silicon dioxide is deposited onto the chamber walls and ceiling as well as other parts of the reactor chamber, changing the characteristics of the chamber and giving rise to particulate contamination. Therefore, the reactor chamber must be cleaned periodically to remove all such deposits and residue therefrom. Removal of silicon dioxide deposits is accomplished by introducing a fluoride-containing etchant gas such as $NF_3$ (for example) into the chamber and striking a plasma to perform a chamber cleaning operation.

One limitation of inductively coupled plasma reactors is that they require more time to perform a chamber cleaning operation due to their larger volumes, low operational pressure, non-conductive ceilings and lack of bias of the chamber wall surfaces. Certain residues, such as silicon dioxide, typically have relatively low etch rates at low ion energies, and therefore can be difficult to remove by inductively coupled plasmas.

One problem with such a chamber cleaning operation is that the various surfaces of the reactor chamber interior are not cleaned (etched) at the same rate, due to differences in location in the chamber and differences in materials. The plasma density and ion energies are not the same at all locations in the chamber, so that differences in cleaning (etch) rates are quite typical. Moreover, during wafer processing (such as CVD processing), deposits build up more thickly on certain chamber surfaces than on others, so that the deposit or residue thickness is non-uniform throughout the chamber interior. For example, in the etch reactor of the Collins et al. European application referenced above, the etch-process residue is much thicker in the center of the ceiling than at the edge of the ceiling, due to plasma density non-uniformity.

As a result, some metal surfaces are thoroughly cleansed of residue or deposits before others, and the cleaned metal surfaces (e.g., aluminum) are etched while the remaining contaminants are removed from the other still-unclean surfaces. For example, in the case of the flat ceiling electrode of the Collins et al. European application, the edge of the ceiling electrode quickly becomes clean while the center portion still has a thick residue coating remaining thereon. The exposed metal surface of the electrode edge shunts RF energy away from the still-unclean center portion, thereby preventing any further cleaning of the center portion. If a fluoride gas such as $NF_3$ is employed to clean the chamber, the metal surfaces react with the etchant gas during the cleaning operation to form various aluminum fluorides, which redeposit onto various chamber surfaces, including the ones that are still unclean with other residues or deposits. Such aluminum fluorides etch very slowly or are virtually impervious to being etched (particularly in an inductively coupled plasma), thus masking the prior deposits (e.g., silicon dioxide) underneath. This deposition of aluminum fluorides during the cleaning operation prevents the removal of the remaining residues (e.g., silicon dioxide), so that the reactor chamber cannot be thoroughly cleaned, even by extending the duration of the chamber cleaning operation.

A related problem is that some chamber dielectric surfaces (for example, quartz surfaces) are consumed rapidly during a chamber cleaning operation, particularly in an inductively coupled plasma, and must therefore be frequently replaced at great cost, a significant disadvantage.

A problem also exists in regards to the standard radial gas distribution systems employed at the periphery of the base/bottom of the source region of the chamber, such as the system designated G1 in the aforementioned European Patent Application publication No. 0 552 491 A1. These systems typically have a gas distribution ring with inwardly facing radial holes. When these types of systems are used to emit gas, (e.g. silane), during a CVD process to form an oxide layer over the surface of the wafer (e.g. $SiO_2$), the emitted gas tends to diffuse equally in all directions, not just toward the wafer. In the case where silane is being used as the emitted gas, the silane and oxygen from the plasma react together spontaneously. Since the chamber walls are closer to the gas outlet holes than most of the wafer (particularly for larger diameter wafers), deposition of $SiO_2$ over the interior surfaces of the vacuum chamber is greater than that on the wafer. This means that the reactor must be periodically removed from productive activity and the $SiO_2$ coating removed from its interior surfaces, a significant disadvantage.

Thus, there is a need for a reactor which deposits less CVD residue (e.g., $SiO_2$) on the interior chamber surfaces, and which therefore, requires less frequent cleaning.

SUMMARY OF THE DISCLOSURE

The invention is embodied in a plasma reactor having a vacuum chamber with a cylindrical side portion and a ceiling at a certain height above the top of the cylindrical side portion, a wafer-holding pedestal near the bottom of the vacuum chamber, gas injection ports near the cylindrical side portion and a vacuum pump, the reactor including a generally planar disk-shaped conductive ceiling electrode adjacent the ceiling, a helical coil antenna having a bottom winding near the top of the cylindrical side portion and a top winding generally corresponding to the second diameter near the planar disk-shaped conductive ceiling electrode, the helical coil antenna substantially spanning the height between the top of the cylindrical side portion and the ceiling, and a switch for individually connecting each one of the coil antenna, the ceiling electrode and the wafer pedestal to one of (a) a respective RF power source, (b) ground or (c) no potential (i.e., left unconnected or electrically floating).

The invention is also embodied in a plasma reactor having a vacuum chamber, a wafer-holding pedestal near the bottom of the vacuum chamber, gas injection ports and a vacuum pump, the reactor including a generally planar disk-shaped conductive ceiling electrode at the top of the chamber, a generally dome-shaped helical coil antenna having a truncated apex generally coplanar with the ceiling electrode and a base generally coinciding with a circumference of the vacuum chamber, and a switch for individually connecting each one of the coil antenna, the ceiling electrode and the wafer pedestal to one of (a) a respective RF power source, (b) ground or (c) no potential (floating).

The invention is further embodied in a chemical vapor deposition plasma reactor having a vacuum chamber, a wafer-holding pedestal near the bottom of the vacuum chamber and a vacuum pump, the reactor including deposition precursor gas injection ports connectable to a chemical vapor deposition precursor gas source, a generally planar disk-shaped silicon ceiling electrode at the top of the chamber, apparatus for applying RF energy to the interior of the chamber so as to maintain a plasma therein, and a switch for individually connecting selected ones of the RF energy applying apparatus, the ceiling electrode and the wafer pedestal to one of (a) a respective RF power source, (b) ground or (c) no potential (floating).

DETAILED DESCRIPTION OF THE PREFERRED EMBODIMENTS

Overview

Figure 1:
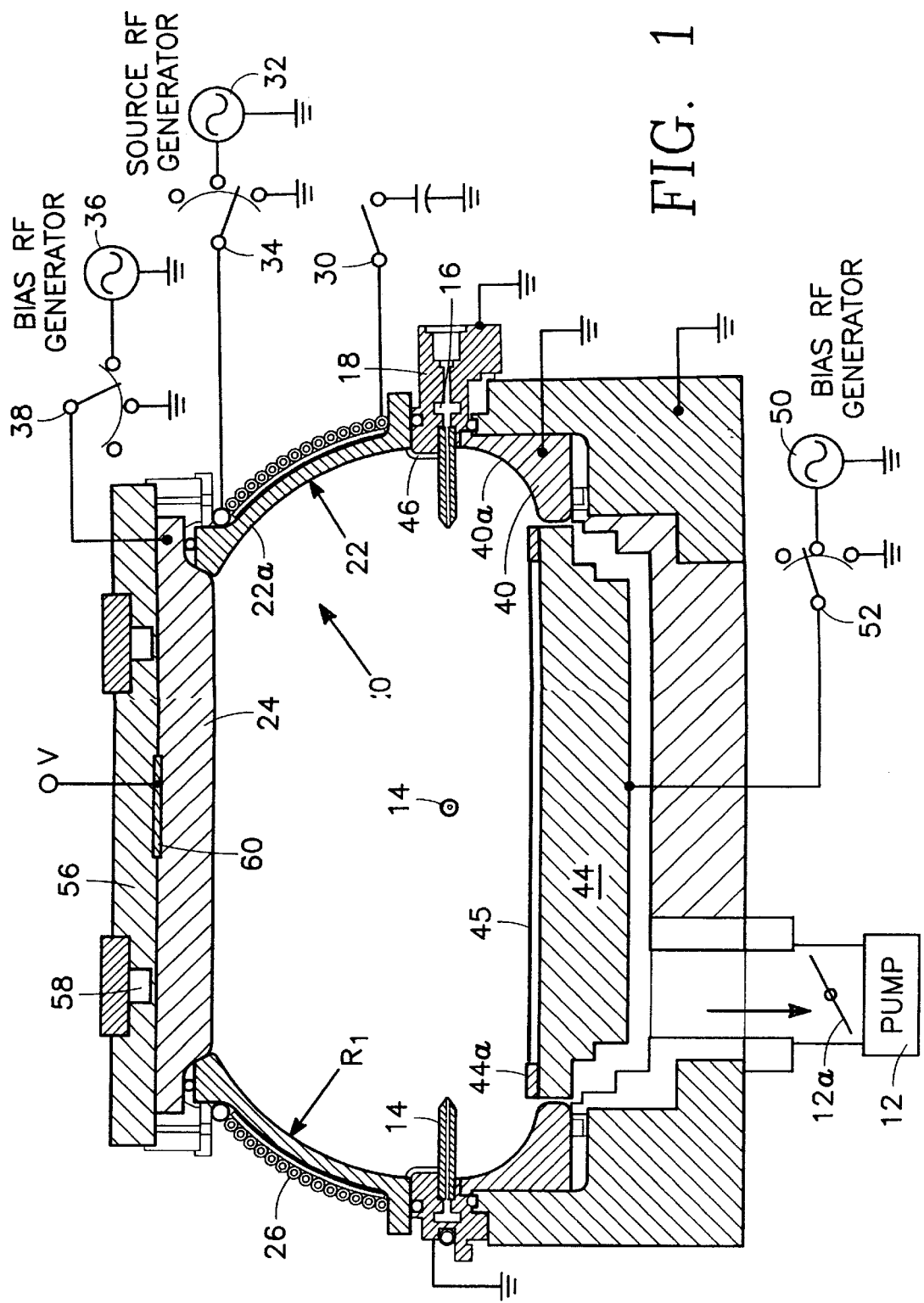
FIG. 1 is a simplified cross-sectional elevational view of a plasma reactor embodying the present invention.

In one aspect, the invention is embodied in a plasma reactor chamber having a dome-shaped helically coiled antenna in the side-portion of the ceiling surrounding a planar electrode in the center-portion of the ceiling. Means are provided for separately coupling RF energy to the coil antenna, the ceiling electrode and the wafer pedestal at the bottom of the chamber, so that any one or combination of the ceiling electrode, the coil antenna and the wafer pedestal can receive RF energy or be grounded or be unconnected (float). The coil antenna provides inductive coupling or capacitive coupling or both depending upon the type of plasma required, the ceiling electrode provides capacitive coupling and, when energized simultaneously, the ceiling electrode and coil antenna together provide combined capacitive and inductive coupling to a plasma inside the reactor chamber. During CVD processing, the coil antenna receives RF energy to provide an inductively coupled plasma while the ceiling electrode is grounded and an RF bias is applied to the wafer pedestal. During chamber cleaning operations, RF energy is applied to the ceiling electrode to strike a capacitively coupled plasma while the wafer pedestal is permitted to electrically float (to avoid damage to the wafer pedestal and associated hardware) and the coil antenna is grounded or permitted to float. Once the capacitively coupled plasma has been ignited, RF energy may be applied to the coil antenna to maintain the plasma at a higher plasma density, thus providing additional species and heat to enhance removal of silicon dioxide and similar compounds.

In an alternative embodiment, RF power is applied to the wafer pedestal while a non-production ("dummy") wafer is held on the pedestal, to strike a capacitively coupled plasma to clean the chamber. In this embodiment, the top electrode is preferably either grounded or has RF power applied to it. This method is also applicable using an inductively coupled plasma. The ceiling electrode is preferably heated to a temperature on the order of between approximately 260° and 270° C. to increase the chamber cleaning rate.

A capacitive plasma can be ignited by (i) applying RF power to the ceiling electrode alone, (ii) simultaneously applying power to the ceiling electrode and the coil, and (iii) simultaneously applying RF power to the ceiling electrode, the coil and the wafer pedestal. Each of these three different modes provides a unique advantage. Applying power to the ceiling electrode helps clean the grounded surfaces and ceiling surface fast. Applying power to both the ceiling electrode and the coil enhances cleaning of dielectric surfaces while cleaning the metal surfaces fast because of enhanced fluorine dissociation and higher plasma temperature. Applying RF power simultaneously to the ceiling electrode, the coil and the wafer pedestal reduces sputtering of the metal chamber wall surfaces by providing additional ground path(s) to the plasma. Thus, the choice of one of the three modes (i), (ii) and (iii) above may be made in accordance with the distribution of deposited oxide residue in the chamber. A "dummy" wafer may be kept on the wafer pedestal during chamber clean operations to protect the pedestal surface from etching. This is particularly preferred when operating in mode (iii) above.

It is not necessarily required to ground the ceiling electrode in order to ignite either an inductively coupled plasma or a capacitively coupled plasma.

For an inductively coupled plasma, RF power is applied to the coils to ignite the plasma while maintaining a certain pressure level (typically between 30 and 300 milli-Torr, depending upon the applied RF power level). Once the plasma is ignited, the pressure may be reduced to less than 30 mTorr to maintain the plasma.

Description of the Reactor Structure

Referring to FIG. 1, a plasma reactor of the preferred embodiment has a vacuum chamber 10, a vacuum pump 12 and gas injection nozzles 14 connected to a gas supply ring manifold 16 in a metal housing 18 supporting the injection nozzles 14. The chamber 10 has a ceiling 20 consisting of a partial dome-shaped or hemispherical annulus 22 surrounding a planar disk 24. The dome-shaped annulus 22 is an insulator such as quartz or a ceramic. The dome-shaped annulus 22 supports a helically coiled RF antenna 26, one terminal of which is connectable through a capacitor to ground by a switch 30 and the other end of which is connectable to an RF source 32 through a switch 34. The structural details, including the length, of the helically coiled RF antenna 26 is disclosed in the above-referenced U.S. patent application by Fairbairn and Nowak, the disclosure of which is incorporated herein by reference. For example, the RF source 32 includes an RF generator and a conventional RF matching network (not shown).

The ceiling 24 is a conductor which is connectable to either an RF source 36 or ground through a switch 38. The bottom of the chamber 10 may include a removable grounded conductive bottom annular ring or liner 40 which may be doped polysilicon or aluminum and a wafer pedestal 44 for holding a semiconductor wafer 45. Preferably, a dielectric annulus 44a coplanar with the top surface of the wafer 45 surrounds the wafer 45 on the pedestal 44. The wafer pedestal 44 may include an electrostatic chuck, cooling fluid channels and other conventional features not crucial to the present invention. The conductive annular ring 40 has a convex curved interior surface 40a facing the interior of the chamber 10 of approximately the same surface area as the ceiling electrode 24. This feature facilitates capacitive discharge and exposes the chamber bottom ground surfaces toward the plasma. As a result, when an RF source is applied to the ceiling electrode 24 and the annular ring 40 is grounded, both are etched at about the same rate, a significant advantage. The removable ring annulus liner 40 is advantageous for periodic maintainance and chamber bottom cleaning.

As noted previously herein, flat ceiling electrodes (such as the type illustrated in the above-referenced European application of Collins et al.) tend to build up contamination (e.g., silicon dioxide) nonuniformly. In the case of an etch reactor with a flat ceiling, the deposit consists primarily of polymer which tends to deposit more on cooler unbiased surfaces, i.e., the outside edges of the ceiling electrode. In the case of a CVD reactor with a flat ceiling, most of the oxide deposit is located in the center of the ceiling electrode across from the wafer. This is due to the sputtering component of the deposition process induced by RF bias of the wafer pedestal. Consequently, in the CVD reactor, the outer portion of the ceiling electrode clears first during chamber clean, regardless of the plasma discharge mode. In order to overcome this problem, the ceiling electrode 24 of the reactor of the present invention (FIG. 1) is reduced to a size less than the diameter of the side wall (but preferably slightly larger than the wafer pedestal 44 but the ceiling electrode diameter could also be diameter), thus eliminating the portion of the ceiling electrode tending to a thinner residue accumulation and therefore to etching or overcleaning.

A related advantage is that the gently curved concave surfaces of the bottom aluminum liner 40 and the quartz dome annulus 22 eliminate sharp corners in the chamber interior which would otherwise be difficult to clean during the chamber clean operation.

Preferably, the materials of the chamber 10 are selected to minimize or eliminate metal surfaces which would otherwise contribute to formation of aluminum fluorides during chamber cleaning operations. Specifically, the ceiling electrode 24 and the bottom annular ring 40 may both be silicon, for example, polysilicon doped to a resistivity less than about 0.2 ohms per centimeter. An advantage of polysilicon is that any silicon removed therefrom during the chamber cleaning (etch) operation is volatile and readily pumped out of the chamber 10. In order to further reduce the possibility of forming aluminum fluoride during chamber cleaning operations, the gas injection nozzles 14 are a ceramic material such as aluminum oxide or aluminum nitride. Moreover, a skirt 46 of quartz, silicon, polysilicon or ceramic covers the metal body 18. Furthermore, the metal body 18 is grounded to reduce the possibility of arcing during chamber cleaning operations. Thus, in the preferred embodiment there are virtually no metal surfaces exposed to the chamber interior. The wafer pedestal 44 is preferably unconnected to any electric potential (i.e., electrically floating) during chamber cleaning operations so that very little etching thereof (or formation of aluminum fluoride therefrom) occurs during chamber cleaning operations.

The wafer pedestal 44 is connectable to ground or an RF source 50, or may be electrically isolated, by a switch 52.

One advantage of the reactor of FIG. 1 is that the coil antenna 26 may be energized simultaneously or after the ceiling electrode 24 has struck a high pressure capacitively coupled plasma in the chamber 10. The advantage of energizing the coil antenna 26 at this point is that it provides an efficient means of maintaining the capacitively coupled plasma and it provides a certain amount of inductive and/or capacitive coupling to the plasma near the quartz annulus 22 so as to etch residues from the quartz annulus 22. This coupling mode causes the quartz material of the annulus 22 to be etched at a rate less than that of a pure low pressure inductively coupled plasma mode, a significant advantage. Furthermore, the inductive coupling provided by the coil antenna 26 generates additional heat in the chamber 10. High temperature greatly enhances the removal of silicon dioxide from the ceiling electrode 24 and other locations in the chamber 10. It should be noted that the ceiling itself serves as a heat sink rather than a heat source because a lid 56 covering the ceiling electrode 24 has cooling jackets 58 running throughout its interior as shown in FIG. 1. The cleaning rate of the ceiling electrode can, however, be accelerated by using an external heat source such as a resistive heater 60 to raise the temperature of the ceiling electrode to between 260° and 270° C. for example.

In one preferred implementation of the reactor of FIG. 1, the radius $R_1$ of curvature of the interior surface 22a of the quartz annulus 22 was 325 cm (13"), the radius of curvature of the interior surface of the bottom ring 40 was 250 cm (9.5"–10"), the diameter D of the ceiling electrode 24 was 225 cm (9"), the diameter of the wafer pedestal 44 was 200 cm (8") and the height of the ceiling electrode 24 from the pedestal 44 was 112 cm (4.5"). However, the invention is not limited to any particular design geometry.

Methods of Operating the Reactor

The invention, in another aspect, is embodied by certain methods of using the multi-mode coupled plasma reactor of FIG. 1. Basically, the plasma reactor of FIG. 1 has three possible plasma coupling modes: (1) a predominantly inductively coupled plasma, (2) a predominantly capacitively coupled plasma, and (3) a mixture of both inductive and capacitive coupling simultaneously, depending upon the pressure regime, chemistry and applied RF power level.

In order to perform chemical vapor deposition of, for example, silicon dioxide onto a wafer 45 held on the pedestal 44, the reactor is operated in the first mode to provide an inductively coupled plasma. A silicon precursor gas such as silane is introduced into the chamber 10 along with an oxygen-containing gas, using the injection nozzles 14 for the silane. The pump valve 12a is positioned to maintain the chamber pressure at or below 100 milliTorr. The ceiling electrode 24 is grounded while 1000–5000 watts of RF energy at between 300 kHz and 14 MHz (preferably 2.0 MHz) is applied from the RF source 32 to the coil antenna 26. The wafer pedestal may be either grounded or floating or an RF bias from the RF source 50 may be applied to the pedestal 44 to generate a suitable plasma sheath voltage over the semiconductor wafer 45 held on the pedestal 44 in accordance with the techniques disclosed in the above-referenced application by Collins et al. and the above-referenced application by Fairbairn and Nowak. In some cases, it may not be necessary to ground the ceiling electrode in order to strike an inductively coupled plasma.

In order to perform a chamber clean operation for a chamber of a volume capable of holding an 8-inch diameter wafer (e.g., between 25 and 30 liters), the chamber pressure is set at between 0.5 and 5 Torr while between 0.5 and 3 liters per minute of a fluorine-containing gas (e.g., $NF_3$, $CF_4$, $C_2F_6$, etc.) and oxygen is pumped into the chamber 10. The wafer pedestal is disconnected and allowed to electrically float by the switch 52, the coil antenna is initially disconnected or grounded by the switches 30, 34 while between 1000 and 5000 watts of RF energy at between 300 kHz and 14 MHz (preferably 1.8 MHz) is applied to the ceiling electrode by the RF source 36 through the switch 38. Once the plasma is struck, the coil antenna 26 may be connected to the RF source 32 by the switch 34 for the following three purposes: (1) the small component of capacitive coupling provided by the coil antenna 26 efficiently maintains the capacitively coupled plasma which has already been struck, (2) the proximity of the coil antenna 26 to the quartz annulus 22 enables etching or cleaning of residue or deposits from the annulus 22 and (3) the inductive coupling of the coil antenna 26 generates heat in the chamber 10, which facilitates the removal of silicon dioxide residues from interior chamber surfaces such as the ceiling electrode 24 and the quartz material around the pedestal.

In order to perform a sputtering or etch operation with purely capacitive coupling, the reactor is operated as described in the preceding paragraph, with the exception that the coil antenna remains disconnected or grounded throughout. The capacitive coupling mode provides much faster etch rates because it is characterized by plasma sheath voltages on the order of 50 volts, while the inductive coupling mode is characterized by plasma sheath voltages on the order of only 5 volts.

Following the above-described chamber clean operation, adsorbed fluorine atoms need to be removed from the chamber interior. For this purpose, a hydrogen-containing plasma is struck in the chamber 10 in the same manner as described with reference to the chamber cleaning operation, with the exception that hydrogen gas (or a hydrogen-containing gas such as silane) is substituted for the $NF_3$ gas.

The capacitive discharge mode is more favorable for chamber cleaning due to a higher voltage drop across the sheet in the vicinity of surface to be cleaned. This results in a higher energy of the ions impinging on the surface, thus facilitating breakdown of the silicon-oxide bond. However, the reactor may be cleaned in either regime, capacitive or inductive coupling. Matching of cleaning rates in different areas of the reactor can be achieved by proper clean regime selection. In fact, a two step clean process may be employed consisting of an inductive mode plasma clean step followed by an capacitive mode plasma clean step. Alternatively, the order of these two steps may be reversed.

In the capacitive clean mode the pressure has to be relatively high (greater than 0.5 Torr) to prevent excessive sputtering of the chamber walls. In the low pressure regime, plasma coupling is primarily inductive and minimal wall surface biasing occurs. The inductive discharge mode leads, however, to generally higher plasma temperatures. A capacitively coupled plasma is very efficient for cleaning the electrodes. It is the inductive enhancement of the generally capacitively coupled plasma described above that helps to clean the quartz dome and other areas of the chamber not directly biased by the capacitive discharge.

The wafer pedestal can be biased, grounded or floating. It is beneficial to be able to so control the pedestal potential in order to either clean the pedestal from residues or, alternatively, to protect it from overcleaning and damage.

A key advantage of the chamber cleaning process described above is that for a given reactor temperature the cleaning process is five to ten times faster than the cleaning process for an inductively coupled high density plasma reactor of the type described in the above-referenced application by Fairbairn and Nowak.

While the invention has been described with reference to a preferred embodiment in which separate individual RF sources are furnished for the ceiling electrode 24 and the coil antenna 26, the coil antenna and the ceiling electrode may be connected together to a common RF source whenever both are to receive RF energy simultaneously.

Other methods of using the reactor of FIG. 1 are useful. By adjusting the ratio of RF power applied to the ceiling electrode 24 and the coil antenna 26, the reactor of FIG. 1 may be operated in a broad pressure range from below 10 milliTorr to 15 Torr, the lower pressure regimes favoring a predominantly inductively coupled plasma and the high pressure regimes favoring a predominantly capacitively coupled plasma.

The problem of depositing excessive amounts of CVD residue (e.g., $SiO_2$) on the interior chamber surfaces is solved in the embodiment of the invention shown in FIG. 1 by the periodically circumferentially spaced radially inwardly-directed gas feed nozzles 14 each connected through the cylindrical chamber side wall to the gas supply manifold 16 therein. The nozzles 16 extend from the chamber side wall to points close to the periphery of the wafer 45, but do not overlie it. This arrangement allows the release of CVD gas (e.g. silane) very near the wafer 80, rather than adjacent the chamber sidewalls, thus increasing deposition on the wafer 45, and decreasing deposition on the chamber sidewalls.

It is noted that structural elements, such as the nozzles 14, placed near the wafer periphery are subject to heating. If the nozzles 14 are heated while a CVD gas, such as silane, is flowing through them, a possibility exists that amorphous silicon residues could form in the interior of the nozzles 14. This could result in nozzle failure. However, heating does not present a problem with the nozzle arrangement shown in FIG. 1 because the chamber wall 102 acts as a heat sink to the nozzles 14, cooling the nozzles 14 well-below the temperature at which silane tends to break down to form amorphous silicon.

It is further noted that structural elements placed near the periphery of the wafer could adversely affect the density of the plasma. However, the nozzles 14 present such a small cross-section to the plasma that there is little loss of the plasma density. In addition, the nozzles 14 extend close to, but not over the wafer 45, to minimize any impedance between the plasma and the wafer 45.

In order to achieve a uniformity of deposition across the surface of the wafer 45, at least four, and as many as twelve nozzles 14, could be spaced around the periphery of the wafer 45. For example, with an 8-inch wafer surface, more than eight periodically spaced nozzles are preferred.

While the invention has been described in detail by specific reference to preferred embodiments, it is understood that variations and modifications thereof may be made without departing from the true spirit and scope of the invention.

What is claimed is:

1. A plasma reactor having a vacuum chamber with a cylindrical side portion of a first diameter and a ceiling at a certain height above the top of said cylindrical side portion, a wafer-holding pedestal adjacent the bottom of said vacuum chamber, gas injection ports adjacent said cylindrical side portion and a vacuum pump, said reactor comprising:
    a generally planar disk-shaped conductive ceiling electrode adjacent said ceiling, said ceiling electrode being substantially the same in diameter as the wafer held in said wafer-holding pedestal;
    a coil antenna wound around a space between said conductive ceiling electrode and said wafer-holding pedestal; and
    a switch for individually switching selected ones of said coil antenna, said ceiling electrode and said wafer-pedestal between at least two of (a) a respective RF power source, (b) ground, (c) a floating potential.

2. The reactor of claim 1, wherein said coil antenna is a helical coil antenna having a bottom winding near said top of said cylindrical side portion and a top winding near said planar disk-shaped conductive ceiling electrode, said helical coil antenna substantially spanning said height between said top of said cylindrical side portion and said ceiling.

3. The reactor of claim 1 wherein said coil antenna and said top annular chamber wall are dome shaped.

4. The reactor of claim 1 wherein said switch is capable of permitting said wafer pedestal to electrically float.

5. The reactor of claim 1 further comprising a top annular chamber wall generally coinciding with said helical coil antenna and shielding said coil antenna from the interior of said vacuum chamber.

6. The reactor of claim 5 wherein said top annular chamber wall is an insulator material.

7. The reactor of claim 6 wherein the insulator material of said top annular chamber wall comprises quartz.

8. The reactor of claim 1 wherein said ceiling electrode comprises silicon.

9. The reactor of claim 8 wherein the silicon of said ceiling electrode comprises doped polysilicon.

10. The reactor of claim 1 further comprising a gas manifold housing in said cylindrical side portion of said chamber and plural gas injection nozzles connected to said gas manifold housing and facing radially inwardly toward the wafer-holding pedestal, said gas injection ports comprising orifices at the ends of said nozzles, wherein said nozzles comprise a ceramic material.

11. The reactor of claim 10 further comprising a protective skirt shielding said gas manifold housing from the interior of said vacuum chamber.

12. The reactor of claim 11 wherein said protective skirt comprises one of: (a) quartz, (b) silicon, and (c) ceramic.

13. A plasma reactor having a vacuum chamber, a wafer-holding pedestal adjacent the bottom of said vacuum chamber, gas ports and a vacuum pump, said reactor comprising:
    a generally planar disk-shaped conductive ceiling electrode at the top of said chamber, said ceiling electrode being substantially the same in diameter as the wafer held in said wafer-holding pedestal;
    a coil antenna disposed about a space between said ceiling electrode and said wafer-holding pedestal; and
    a switch for individually switching selected ones of said coil antenna, said ceiling electrode and said wafer pedestal between at least two of (a) a respective RF power source, (b) ground, (c) floating potential.

14. The reactor of claim 13, wherein said coil antenna is a helical coil antenna having a top generally coplanar with said ceiling electrode and a base generally coinciding with a circumference of said vacuum chamber.

15. The reactor of claim 14 further comprising a quartz dome-shaped ceiling wall adjacent said helical coil antenna and shielding said coil antenna from the interior of said vacuum chamber.

16. The reactor of claim 15 further comprising:
    a gas manifold housing surrounding said chamber and plural gas injection nozzles connected to said gas manifold housing and facing radial inwardly toward the wafer-holding pedestal, said gas ports being gas injection ports comprising orifices at the ends of said nozzles, wherein said nozzles comprise a ceramic material; and,
    a protective skirt shielding said housing from the interior of said vacuum chamber.

17. The reactor of claim 14 wherein said wafer-holding pedestal is generally displaced below the base of said dome-shaped ceiling wall by a height, said reactor further comprising a bottom annular chamber wall having an outer edge generally coinciding with the circumference of said vacuum chamber, said bottom annular chamber wall projecting into said chamber from said outer edge and terminating at an inner edge adjacent said wafer pedestal.

18. The reactor of claim 17 wherein said bottom annular chamber wall has an interior surface facing the interior of said chamber, said interior surface having a generally circular cross-section.

19. The reactor of claim 18 wherein said bottom annular chamber wall comprises one of: (a) doped polysilicon and (b) aluminum.

20. The reactor of claim 17 wherein said bottom annular chamber wall has an interior surface facing the interior of said chamber, said interior surface having approximately the same surface area as the surface of the ceiling electrode facing the wafer-holding pedestal.

21. The reactor of claim 14 wherein said ceiling electrode comprises doped polysilicon.

22. The reactor of claim 14 wherein said coil antenna is generally dome-shaped and wherein said top of said coil antenna is a truncated apex.

23. A chemical vapor deposition plasma reactor having a vacuum chamber, a wafer-holding pedestal adjacent the bottom of said vacuum chamber and a vacuum pump, said reactor comprising:
    deposition precursor gas injection ports connectable to a chemical vapor deposition precursor gas source;
    a generally planar disk-shaped silicon ceiling electrode at the top of said chamber, said ceiling electrode being substantially the same in diameter as the diameter of a wafer held in said wafer-holding pedestal;
    means for applying RF energy to the interior of said chamber so as to maintain a plasma therein; and
    a switch for individually switching selected ones of said means for applying, said electrode and said wafer pedestal between at least two of: (a) a respective RF power source, (b) ground and (c) a floating potential.

24. The reactor of claim 23 wherein said means for applying comprises means for maintaining an inductively coupled plasma in said chamber.

25. The reactor of claim 24 herein said means for applying comprises a coil antenna.

26. The reactor of claim 25 wherein said coil antenna has a generally dome shape and is helically wound with a truncated apex generally coplanar with said ceiling electrode and a base generally coinciding with a circumference of said vacuum chamber.

27. The reactor of claim 23 wherein said means for applying comprises means for maintaining a capacitively coupled plasma in said chamber.

28. A plasma reactor having a vacuum chamber with a ceiling, a wafer-holding pedestal adjacent the bottom of said vacuum chamber and a vacuum pump, said reactor comprising:
a generally planar disk-shaped conductive ceiling electrode adjacent said ceiling, said ceiling electrode being substantially the same in diameter as the wafer held in said wafer-holding pedestal;
a coil antenna wound around a space between said conductive ceiling electrode and said wafer-holding pedestal;
a switch for individually switching selected ones of said coil antenna, said ceiling electrode and said wafer pedestal between at least two of (a) a respective RF power source, (b) ground, (c) a floating potential; and
a plurality of straight, elongate, projecting tubes forming gas injection nozzles extending inward from a side wall of said vacuum chamber toward an area overlying said wafer support, each of said nozzles being capable of injecting a processing gas into the vacuum chamber in an inwardly direction.

29. The plasma reactor of claim 28 wherein the distal end of each of the nozzles is disposed no closer to a wafer held by said wafer-holding pedestal than an edge thereof.

30. The plasma reactor of claim 28 wherein the nozzles are thermally coupled to the side wall of the vacuum chamber.

31. The plasma reactor of claim 28 wherein the nozzles extend away from the side wall of the vacuum chamber from a point between the lower end of the coil antenna and the wafer-holding pedestal, so as to introduce gas directly into a portion of the chamber between the lower end of the coil and the wafer-holding pedestal.

32. The plasma reactor of claim 28 wherein the nozzles comprise a ceramic material.

33. A plasma deposition reactor for use with chemical vapor deposition, comprising:
a vacuum chamber with a generally cylindrical portion;
a coil antenna disposed around a first region above said cylindrical portion;
a substrate holder disposed below said cylindrical portion for holding a substrate and including a substrate electrode;
a generally planar disk-shaped conductive ceiling electrode disposed above said first region, said ceiling electrode being substantially the same in diameter as the substrate held in said substrate holder;
a plurality of straight, elongate, projecting tubes forming gas injection nozzles extending inward from said generally cylindrical portion between said coil antenna and said substrate holder toward an area overlying said wafer support, each of said nozzles being capable of injecting a processing gas in an inwardly direction directly into a portion of the chamber between a lower end of the coil antenna and the wafer-holding pedestal; and
switches for selectively connecting each of said coil antenna, said substrate electrode, and said ceiling electrode between at least two of (a) a respective RF power source, (b) ground, and (c) a floating potential.

34. The reactor of claim 33, wherein said switches selectively connect said coil antenna across said respective RF power source and ground both sides of said coil antenna.

35. The reactor of claim 34, wherein said coil antenna is arranged around a dome shaped region above said first region.

36. The reactor of claim 33, wherein said ceiling electrode comprises silicon.

37. A plasma reactor, comprising:
a vacuum chamber comprising a substantially dome-shaped portion;
a non-spherical dome-shaped helical coil antenna with a central void at the top thereof disposed around said dome-shaped portion of the chamber, said coil antenna being capable of forming a plasma in an area within the chamber surrounded by said coil antenna; and,
a substrate holder disposed below said dome shaped portion of the chamber for holding a substrate;
a substantially planar disk-shaped conductive ceiling electrode disposed above said dome-shaped portion of the chamber and having a surface facing the interior of said chamber with a diameter substantially the same as a diameter of a substrate held in said holder; and wherein,
the substrate held in said holder is substantially evenly spaced from a plasma formed within the chamber by said coil antenna such that a substantially uniform etch rate is achieved across an exterior facing surface of said substrate whenever the reactor is employed in an etching process and a substantially uniform deposition of material is achieved across said exterior facing surface of the substrate whenever the reactor is employed in a deposition process.

38. The reactor of claim 37, wherein a base of said coil antenna substantially coincides with a base of said dome-shaped portion of said vacuum chamber.

39. The reactor of claim 38, wherein:
said vacuum chamber further comprises a substantially cylindrical portion underlying said dome-shaped portion; and,
said substrate holder is disposed below said cylindrical portion of the chamber for holding a substrate, thereby creating a separation between the base of the coil antenna and the substrate holder.

40. The reactor of claim 37, wherein the void forming the top of said coil antenna has a diameter exceeding that of a substrate held in said substrate holder.

41. The reactor of claim 37, wherein said top of said coil antenna is substantially coplanar with a void forming a top of said dome-shaped portion.

42. A plasma reactor, comprising:
a vacuum chamber comprising a substantially dome-shaped annular portion overlying a substantially cylindrical portion;
a dome-shaped helical coil antenna with a central void at the top thereof, said coil antenna disposed around said dome-shaped annular portion of the chamber, a substrate holder disposed below said cylindrical portion of the chamber for holding a substrate; and a substantially planar disk-shaped conductive ceiling electrode disposed above said annular portion of the chamber and having a surface facing the interior of said chamber with a diameter substantially the same as a diameter of the substrate held in said holder.

43. The reactor of claim 42, wherein said top of said coil antenna is substantially coplanar with a void forming a top of said dome-shaped annular portion and a base of said coil antenna substantially coincides with a base of said dome-shaped annular portion.

44. The reactor of claim 42, wherein the void forming the top of said coil antenna has a diameter exceeding that of a substrate held in said substrate holder.

45. The reactor of claim 42 wherein said ceiling electrode forms a top of the chamber.

46. The reactor of claim 42, further comprising a plurality of straight, elongate, projecting tubes forming gas injection nozzles extending inward from a side wall of said vacuum chamber toward an area overlying said wafer support, each of said nozzles being capable of injecting a processing gas into the vacuum chamber from a point between a base of said coil antenna and said substrate holder in an inwardly direction.

47. The reactor of claim 46 wherein a distal end of each of said nozzles is disposed no closer to a substrate held by said substrate holder than an edge thereof.

* * * * *